(12) United States Patent  (10) Patent No.: US 8,919,757 B2
Suen  (45) Date of Patent: Dec. 30, 2014

(54) APPARATUS FOR REMOVAL OF DOCKING PLATE IN SEMICONDUCTOR EQUIPMENT

(75) Inventor: Bing-Yi Suen, Hsinchu (TW)

(73) Assignee: Macronix International Co., Ltd. (TW)

( * ) Notice: Subject to any disclaimer, the term of this patent is extended or adjusted under 35 U.S.C. 154(b) by 927 days.

(21) Appl. No.: 13/049,317

(22) Filed: Mar. 16, 2011

(65) Prior Publication Data

US 2012/0235338 A1    Sep. 20, 2012

(51) Int. Cl.
*B23Q 3/00*  (2006.01)
*H05K 5/02*  (2006.01)

(52) U.S. Cl.
CPC ........................................ *H05K 5/023* (2013.01)
USPC ...................................................... 269/289 R

(58) Field of Classification Search
USPC .................. 269/289 R, 43, 246, 903, 21, 228
See application file for complete search history.

(56) References Cited

U.S. PATENT DOCUMENTS

| 5,438,740 A * | 8/1995 | Carr et al. ...................... 29/33 P |
| 2010/0014223 A1 * | 1/2010 | Chen et al. ............... 361/679.01 |
| 2012/0170215 A1 * | 7/2012 | Fan et al. ................. 361/679.59 |

* cited by examiner

*Primary Examiner* — Lee D Wilson
*Assistant Examiner* — Nirvana Deonauth
(74) *Attorney, Agent, or Firm* — Volpe & Koenig, P.C.

(57) ABSTRACT

The present invention relates to an apparatus for removal of docking plate, wherein comprising a docking plate base device; and a handle removably joined to the docking plate base device and causing the docking plate base device to be removed from the semiconductor equipment when the handle is joined to the docking plate base device.

17 Claims, 3 Drawing Sheets

APPARATUS FOR REMOVAL OF DOCKING PLATE IN SEMICONDUCTOR EQUIPMENT

FIELD OF THE INVENTION

The present invention relates to an apparatus for removal of docking plate, in particular an apparatus for removal of docking plate in semiconductor equipment.

BACKGROUND OF THE INVENTION

Semiconductor manufacturing engineering is a processing technology including plasma etching and deposition used for producing silicon wafers in which has a clean procedure must be performed to reduce equipment fault time by efficient removal of connecting apparatus including docking O-ring and docking plate. Therefore, engineers are trained to periodically stop the semiconductor running equipment, to remove all connecting apparatus and to clean all parts which contain pollution of article through the above etching and deposition process.

With an example for taking apart of docking plate with hammer grasped by hand, the method is the traditional way to unload the docking plate and repeat tapping is necessary since the docking plate is tightly attached to the channel which is a joint of two neighboring chambers of semiconductor equipment. However, this manner is not only consuming significant time but is also easily to damage the docking plate which has a high cost in price and is not always available in the tool market due to a small amount of quantity in semiconductor equipment deployment. For the requirement of continuous producing wafers in semiconductor industry, the above method will put in uncertainty interruption factor to tightly processing schedule and a consequence to semiconductor engineers, the method is apparently not applicable.

Furthermore, an equipment downtime which is ranged a couple of hours is needed to merely taking off the docking plate that is a required procedure to the replacement of docking O-ring. Due to physical enforcement on the hammer, this is not only to say a waste of energy and but clearance of space for applying the force which will result in increasing complexity to redeploy all apparatuses for restart of the semiconductor equipment. A high attention must be paid during this removal action, otherwise, damage to the docking plate will cause a beyond repaired condition. And reordering the toll and a expenditure are unavoidable, while in the same time, a downtime for waiting the arrival of new docking plate is also harmful to intensive working tempo in semiconductor industry.

From above mentioned, a new removal method and apparatus for docking plate is needed urgently. Thus, based on the drawbacks of prior art, the inventor gave the utmost attention and finally invented the removal apparatus for docking plate with experiment and research. Based on the spirit to work with perseverance, the problem of prior art was solved. The particular design in the present invention not only solves the problems described above, but also is easy to be implemented. Thus, the invention has the utility for the industry.

SUMMARY OF THE INVENTION

The original concept is to figure out a method for docking plate removal which can efficiently speed up the traditional hammer method and reduce any damage cost of the docking plate to ensure wafer processing schedule can be performed seamlessly without significant interruption during maintenance period. In addition, a stock and/or reordering of new docking plate which will add unexpected effect on smoothly designed clean procedure for semiconductor manufacturing equipment can be eliminated due to the simplified and reliable invention disclosed thereafter.

According to above thought, a docking plate combination for a semiconductor equipment, including: a docking plate base device; and a handle removably joined to the docking plate base device and causing the docking plate base device to be removed from the semiconductor equipment when the handle is joined to the docking plate base device.

Preferably, the present invention which addresses the docking plate combination, wherein the handle has a separating mechanism and is pivotally connected to the docking plate base device through the separating mechanism, and the separating comprises: plural pedestals, each of which has at least one hole, wherein the at least one hole has a thread therein; and plural struts.

Preferably, the present invention which addresses the docking plate combination, wherein the docking plate base device has plural screw infixing ports, and the plural pedestals are fixed to the docking plate base device through the plural screw infixing ports with plural threaded fasteners.

Preferably, the present invention which addresses the docking plate combination, wherein the plural pedestals, the plural struts and the handle are made of one being selected from a group consisting of an aluminum, a stainless steel, a carbon steel and a combination thereof.

Preferably, the present invention which addresses the docking plate combination, wherein the at least one hole is located in the center of the pedestal.

Preferably, the present invention which addresses the docking plate combination, wherein the semiconductor equipment is one of a plasma deposition machine and an etching machine.

Preferably, the present invention which addresses the docking plate combination, wherein the semiconductor equipment has a through-hole, and the docking plate base device is in a rectangular shape and is fixed to the semiconductor equipment via the through-hole.

Preferably, the present invention which addresses the docking plate combination, wherein the docking plate base device is used to provide one of a channel and a pipeline between two neighboring chambers of the semiconductor equipment for a gas flow of vapor deposition, and is connected with a docking O-ring within the through-hole of the semiconductor equipment.

According to above thought, a docking plate for a semiconductor equipment, including: a docking plate base device; and an engagement apparatus configured on the docking plate base device and removably connected to a force medium for removing the docking plate base device from the semiconductor equipment.

Preferably, the present invention which addresses the docking plate, wherein the engaging apparatus further comprises: plural pedestals, each of which has at least one hole, wherein the at least one hole has a thread therein; plural struts; and a handle connected to the plural pedestals through the plural struts.

Preferably, the present invention which addresses the docking plate, wherein the handle is removably and pivotally connected to the docking plate base device such that the docking plate is removed from the semiconductor equipment when a pull force is applied to the handle.

Preferably, the present invention which addresses the docking plate, wherein the at least one hole is used to join the docking plate base device and the engaging apparatus.

Preferably, the present invention which addresses the docking plate which further including a hand-held part, wherein the docking plate is taken apart from a docking O-ring of the semiconductor equipment by imposing a pull force on the hand-held part.

Preferably, the present invention which addresses the docking plate according to claim 13, wherein the docking O-ring including an elastomeric material provides sealing of opposing planar surfaces of the docking plate base device and of a processing module of the semiconductor, the opposing planar surfaces are juxtapositioned, and the docking plate base device and the processing module are concentrically positioned.

According to above thought, a docking plate for a semiconductor equipment, including: a docking plate base device; and an engaging apparatus removably configured on the docking plate base device so as to remove the docking plate base device from the semiconductor equipment.

The present invention may best be understood through the following descriptions with reference to the accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purposes of illustration and description only; it is not intended to be exhaustive or to be limited to the precise form disclosed.

Figure 1:
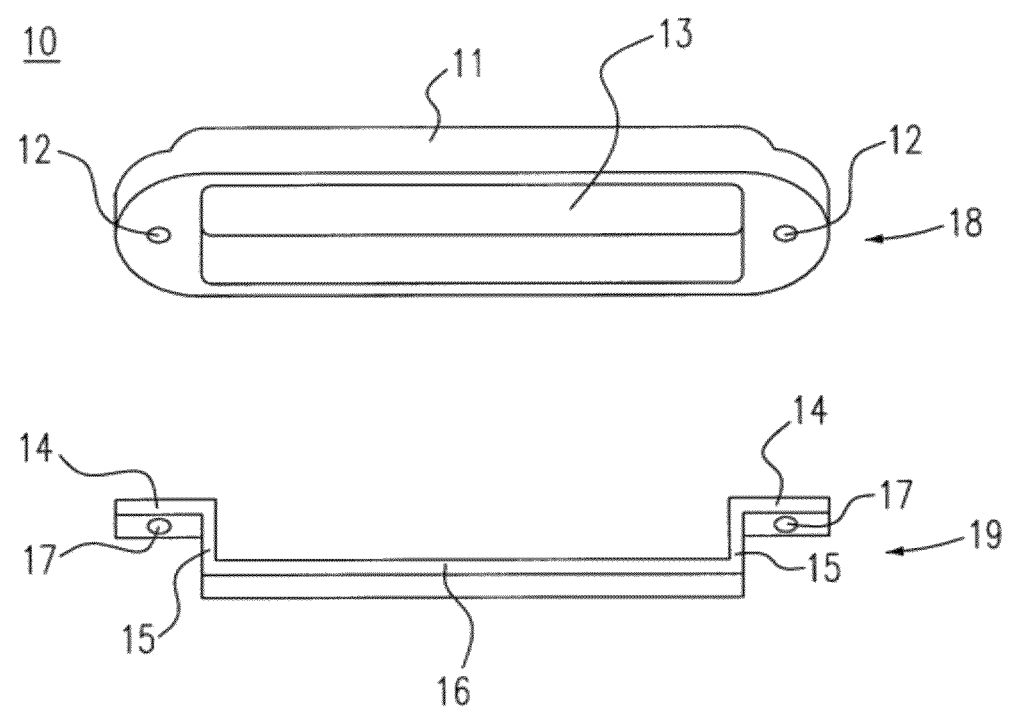
FIG. 1 is a diagram of a docking plate combination which is used in a semiconductor equipment according to the first embodiment of the present invention.
Figure 4:
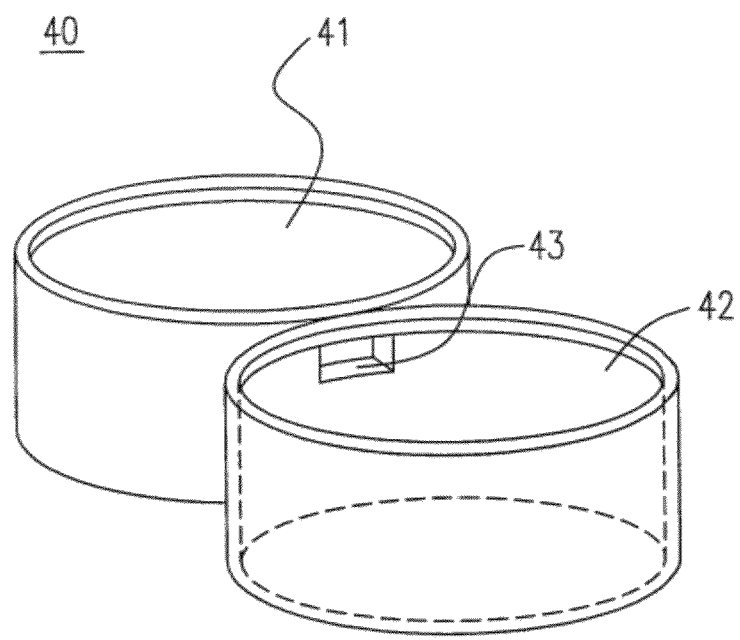
FIG. 4 is diagrams showing two chambers of semiconductor equipment are connected through a channel where the docking O-ring and docking plate residing according to the preferred embodiment of the present invention.

Please refer to FIGS. 1 and 4, the docking plate combination 10 in FIG. 1 is a connection between the neighboring chambers 41, 42 and can be inserted into and taken apart from the channel 43 in FIG. 4 by applying a pull force on the handle body 16 of the combination 10. Care must be made with gently increasing the pull force with shaking left end and right end without causing permanent damage to the physical metal substance which is physical contact to the channel 43 surface of the semiconductor equipment. Once the docking plate combination 10 is removed from the channel 43 of semiconductor equipment, the docking O-ring can further be drawn out for replacement purpose. This is a routine in maintaining the healthy condition of etching and deposition of semiconductor equipment, which can be treated as key element of great improvement to shorten the previous consumed maintenance time. In the other words, the docking O-ring which can seal the gap of connected devices to prevent gas escape and particle contamination is duly substituted with highly acceptable efficiency and can lead to the reduction of misalignment to get away from malfunction of etching and deposition and consequently the requirement of readjusting with docking O-ring in an unnecessary way. As a matter of course, the initial easily substituted with the elastomeric O-ring will definitely trigger a chain reaction for maintenance work to have positive attitude in quick succession for the following clean steps of the semiconductor equipment, and can also mitigate the loads resulted from uncomfortable and suspicious thought when a right action is needed to perform during the whole clean process.

Please keep referring to FIG. 1, which is a diagram illustrating the first embodiment according to the present invention. The docking plate combination 10 includes a docking plate 18 having two screw holes 12, a physical metal substance 11 and a central hollow space 13 and an engagement apparatus or handle 19 having one handle body 16, two struts 15, two pedestals 14 and two screw holes 17.

For performing removal of docking plate, first of all, the engagement apparatus or handle 19 which includes the handle body 16, plural pedestal 14 and plural struts 15 is aligned to the docking plate 18 through the holes 12, 17 which can be inset rotationally with the screws 31. Usually, we perform the join during the clean maintenance when the equipment is stopped and the temperature is low inside the chambers. Once the docking plate 18 and the engagement apparatus or handle 19 are connected, they form the docking plate combination 10.

Without doubt to say, the docking plate combination 20 can be taken apart from the channel 43 between the neighboring chambers 41, 42 by applying a pull force on the handle 26 of the combination. Care must be made with gently increasing the pull force with shaking left and right without causing permanent damage to the physical metal substance which is physical contact to the channel 43 surface of the semiconductor equipment. Once the docking plate combination is removed from the chamber of semiconductor equipment, the docking O-ring can further be drawn out for replacement purpose.

Figure 2:
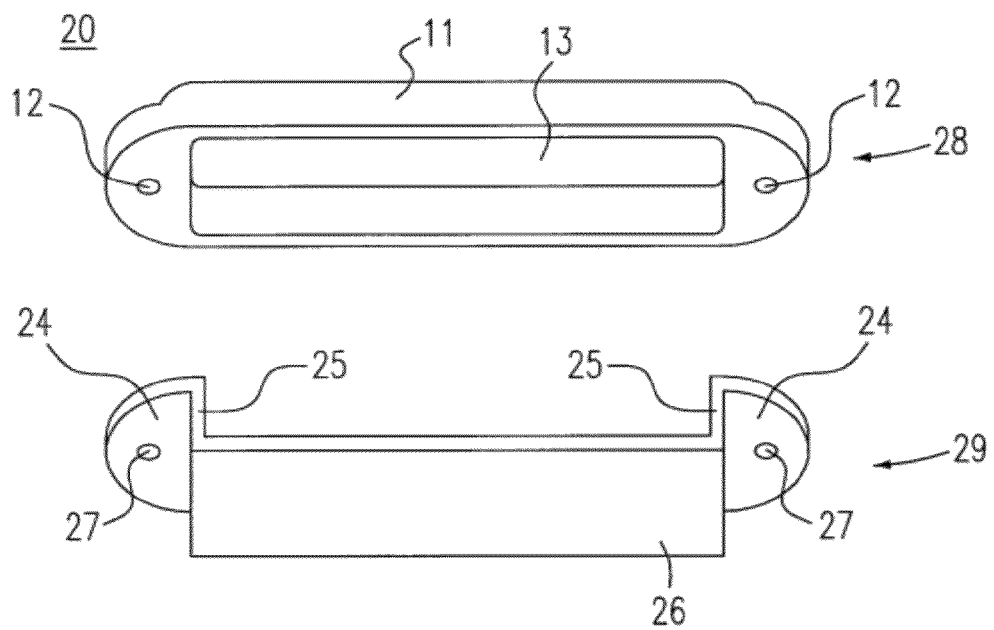
FIG. 2 is a diagram of a docking plate combination which is used in a semiconductor equipment according to the second embodiment of the present invention.

Please refer to FIG. 2, which is a diagram illustrating the second embodiment according to the invention. The docking plate combination 20 illustrates the apparatus which includes the docking plate 28 having two screw holes 12, the physical metal substance 11 and the central hollow space 13 and an engagement apparatus 29 having one handle 26, two struts 25, two pedestals 24 and two screw holes 27. The difference existed from the first embodiment will be that the engagement apparatus 29 has a coincidence in shape with the docking plate, hence, a more integrated visual impact to the novice can make practical lesson of removal of the docking plate combination easily.

In the first and second embodiments of the invention, the handle body 16, 26 and separation mechanism which contains plural pedestals 14, 24 and plural struts 15, 25 or the engagement apparatus or handle 19, 29 are made of one of an aluminum, a stainless steel and a carbon steel. Take aluminum as an example, it is a soft, durable lightweight, ductile metal and corrosion resistance ranges it an ideal substance for exposing to corrosive environment. By the way, it is 100% recyclable and can produce no burden to environment protection.

Figure 3:
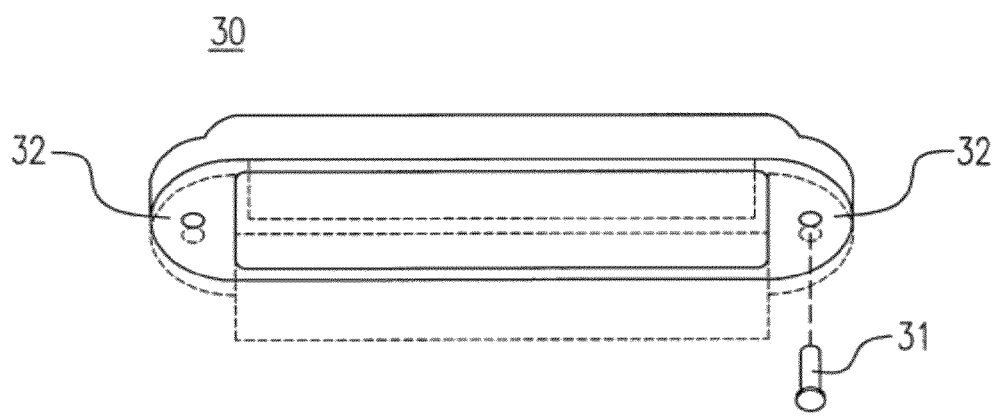
FIG. 3 is a diagram showing how the docking plate and the handle are connected through plural pedestals, plural struts and plural screws according to the preferred embodiment of the present invention.

For performing removal of docking plate, first of all, the engagement apparatus 29 which includes the handle 26, plural pedestal 24 and plural struts 25 is aligned to the docking plate 28 through the holes 12, 27 which can be inset rotationally with the screws 31 as shown in FIG. 3. Usually, we perform the join during the clean maintenance when the equipment is stopped and the temperature is low inside the chambers. Once the docking plate 28 and the engagement apparatus 29 are connected, they are formed to a docking plate combination 20 and where a distributed stress executed on plural pedestal 32 during taking apart of the combination 20. Usually, we perform the join during the clean maintenance when the equipment is stopped and the temperature is low inside the chambers as well.

The substance material of the engagement apparatus can be classified as machining metal which has but not limited to one being selected from an aluminum, an stainless steel and an carbon steel or their combination thereof, and these requirements can limit the adoption of specific alloy in the apparatus in the consequence of most semiconductor equipment deployed areas current dates being democratic burgeon and not allowed for Ozone-depleting substances in the semiconductor process from unregulated debate. Therefore, an unclear and misuse in material of engagement apparatus can be devastated for the enforcement to the high classification in equipment selection of semiconductor industry, and shall be contradict to a numbers of other environment conservation rules among clean energy saving, prohibited substance introduce and greenhouse effect reduction which are crucial to our human survival.

Where a special attention is needed, the docking plate is costly compared to the wages of a technician which means an unsuitable operation by hammer held in hands represents a damage and lost equal to building confidence and mutual trustfulness resulted from the trade of semiconductor equipments in coalition of West and East countries. That is to say, the invention is a redeemable solution to commonly seen technique in clean process for the equipment, and can be treatment for a fluently flawless procedure in maintenance without sacrificing temporary unsolved chaos which is not permitted for a skilled technician who is put in the list of the assigned maintaining schedule for the plasma etching and deposition semiconductor equipments which is the mask manufacturing equipments for processing plural wafers.

Afterwards, a substantially amount of time is saved, the rate of replace docking O-ring can be fastened and clean type of three proven cleaning tools which include the static neutralization, the high velocity compressed air and the advanced high efficient particular air (HEPA) filtration can be working well for clean process to the equipment and eventually fulfilling of ISO class clean room to leverage a well qualified manufacturing state owing to uncompromised delicate palate in purification requisition for the air flow.

Please refer to FIG. 4, which is a diagram showing two chambers of semiconductor equipment which are connected through a channel where the docking O-ring and docking plate resides according to the preferred embodiment of the present invention. Owing to the plasma etching and deposition semiconductor process, the docking plate which has the function of obstructing air flow and/or providing a connection of the chambers 41, 42 through the channel 43 is a key element in the fabrication sequence and control process of ICs and chips, especially for materials science in semiconductor processing which provides a unique and much needed forum for the discussion of experimental and theoretical materials research stimulated by and applied to semiconductor processing.

Although the above mentioned embodiment of the invention is to dispose an apparatus which can efficiently remove the docking plate for the replacement purpose of docking O-ring, the techniques of infixed the handle with docking plate base device through the plural pedestal and therein applying force to gently remove the docking plate combination from the semiconductor equipment is consisting with original thought which can greatly save maintenance time and device cost due to broken caused by hammering down the docking plate base device and this presenting an innovative improvement in part of the semiconductor processing technology. This is to say, the engagement apparatus which is removably and pivotally connected to the docking plate base device can contain the effect of improving the semiconductor manufacturing process and this characteristic is also in the scope of this invention.

The time saving and cost down of semiconductor process is reached.

In order to confirm the efficacy of this invention, the advantage of applying the removably engagement apparatus in embodiments is observed below.

In order to replace the docking O-ring which is a must be procedure after a defined working hours for the semiconductor equipment since contamination being formed on the O-ring surface and a worn characteristic of the O-ring sealing material caused by corrosive gaseous matter which contained high temperature, the invention has the capability for taking apart of the docking plate from the channel of the semiconductor equipment which usually spends three and half hours. With the implementation of the invention this spending time of the docking plate removal can be shortened to only half hours. By the way, the traditional method of removing the docking plate device by hammering with hands that is in easy of damaging the device will cost anther one and half thousand dollars to replace a new one. These intolerable interruptions in maintaining process are harmful for a skilled operation moves which are requisite to perform with highly reliable and efficient way during wafer process.

Besides, according to the measurement result of the embodiment in this invention revealed, wherein the engagement apparatus is manufactured with firm and solid materials which can be reused many times without spared duplicate ones in stock needed. And this will not cause another burden to the adding component list of the equipment which has already a bunch of existing assembly devices, therefore, the processing time and device cost are saved with this proven ideas which can be realized in minimized effect to the original process.

In summary the embodiment of above mentioned invention, the docking plate base device can be removed from the channel of a semiconductor equipment which is a mask manufacturing equipment including plasma etching and deposition of wafer for replacement of docking O-ring during the maintenance. These approaches can rapidly fasten the original replacement procedure, in addition, the cost of causing damage to docking plate is limited.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present invention which is defined by the appended claims.

What is claimed is:

1. A docking plate combination for a semiconductor equipment, comprising: a docking plate base device having a rectangular central opening and two screw holes on opposite sides of the opening; and a handle removably joined to the docking plate base, wherein the handle has a separating mechanism and is removably connected to the docking plate base device through the separating mechanism; and the separating mechanism comprises: plural pedestals each having one threaded hole engageable with the docking plate base device screw holes; and plural struts respectively connected to the plural pedestals.

2. The docking plate combination according to claim 1, wherein the docking plate base device has plural screw infixing ports, and the plural pedestals are fixed to the docking plate base device through the plural screw infixing ports with plural threaded fasteners.

3. The docking plate combination according to claim 1, wherein the plural pedestals, the plural struts and the handle are made of one being selected from a group consisting of an aluminum, a stainless steel, a carbon steel and a combination thereof.

4. The docking plate combination according to claim 1, wherein the holes are located in the center of the pedestal.

5. The docking plate combination according to claim 1, wherein the semiconductor equipment is one of a plasma deposition machine and an etching machine.

6. The docking plate combination according to claim 1, wherein the semiconductor equipment has a through-hole, and the docking plate base device is in a rectangular shape and is fixed to the semiconductor equipment via the through-hole.

7. The docking plate combination according to claim 1, wherein the docking plate base device is used to provide one of a channel and a pipeline between two neighboring chambers of the semiconductor equipment for a gas flow of vapor deposition, and is connected with a docking O-ring within the through-hole of the semiconductor equipment.

8. A docking plate combination for a semiconductor equipment, comprising: a docking plate base device having a rectangular central opening and two screw holes on opposite sides of the opening; and an engagement apparatus configured on the docking plate base device and removably connected to a force medium for removing the docking plate base device from the semiconductor equipment, wherein the engagement apparatus further comprises: plural pedestals each having one threaded hole engageable with the docking plate base device screw holes; plural struts respectively connected to the plural pedestals; and a handle body connected to the plural pedestals through the plural struts.

9. The docking plate combination according to claim 8, wherein the handle is removably and pivotally connected to the docking plate base device such that the docking plate combination is removed from the semiconductor equipment when a pull force is applied to the handle.

10. The docking plate combination according to claim 8, wherein the holes are used to join the docking plate base device and the engagement apparatus.

11. The docking plate combination according to claim 8 further comprising a hand-held part, wherein the docking plate combination is taken apart from a docking O-ring of the semiconductor equipment by imposing a pull force on the hand-held part.

12. The docking plate combination according to claim 11, wherein the docking O-ring including an elastomeric material provides sealing of opposing planar surfaces of the docking plate base device and of a processing module of the semiconductor, the opposing planar surfaces are juxtapositioned, and the docking plate base device and the processing module are concentrically positioned.

13. A docking plate combination for a semiconductor equipment, comprising: a docking plate base device having a rectangular central opening and two screw holes on opposite sides of the opening; and an engagement apparatus removably configured on the docking plate base device so as to remove the docking plate base device from the semiconductor equipment, wherein the engagement apparatus further comprises:

plural pedestals each having one threaded hole engageable with the docking plate base device screw holes; plural struts respectively connected to the plural pedestals; and a handle body connected to the plural pedestals through the plural struts.

14. The docking plate combination according to claim 13, wherein the semiconductor equipment is mask manufacturing equipment for processing plural wafers.

15. The docking plate combination according to claim 13, wherein the engagement apparatus is made of one being selected from a group consisting of an aluminum, a stainless steel, a carbon steel and a combination thereof.

16. The docking plate combination according to claim 13, wherein the engagement apparatus is removably and pivotally connected to the docking plate base device such that the docking plate combination is removed from the semiconductor equipment when a pull force is applied.

17. The docking plate combination according to claim 13, wherein the docking plate base device is used to provide one of a channel and a pipeline between two neighboring chambers of the semiconductor equipment for a gas flow of vapor deposition, and is connected with a docking O-ring within a through-hole of the semiconductor equipment.

* * * * *